(12) United States Patent
Ohtake et al.

(10) Patent No.: US 7,999,392 B2
(45) Date of Patent: Aug. 16, 2011

(54) MULTILAYER WIRING STRUCTURE, SEMICONDUCTOR DEVICE, PATTERN TRANSFER MASK AND METHOD FOR MANUFACTURING MULTILAYER WIRING STRUCTURE

(75) Inventors: Hiroto Ohtake, Tokyo (JP); Yoshihiro Hayashi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 99 days.

(21) Appl. No.: 11/908,099

(22) PCT Filed: Mar. 9, 2006

(86) PCT No.: PCT/JP2006/305178
§ 371 (c)(1),
(2), (4) Date: Nov. 11, 2007

(87) PCT Pub. No.: WO2006/095915
PCT Pub. Date: Sep. 14, 2006

(65) Prior Publication Data
US 2008/0136043 A1 Jun. 12, 2008

(30) Foreign Application Priority Data
Mar. 9, 2005 (JP) ................................. 2005-065708

(51) Int. Cl.
*H01L 23/48* (2006.01)
*H01L 23/52* (2006.01)
*H01L 29/40* (2006.01)
*H05K 1/11* (2006.01)

(52) U.S. Cl. .................... 257/775; 257/E23.07; 174/261
(58) Field of Classification Search .................. 257/774, 257/775, E23.07; 174/261–266
See application file for complete search history.

(56) References Cited

U.S. PATENT DOCUMENTS

| 6,163,067 | A * | 12/2000 | Inohara et al. ................ 257/635 |
| 7,238,619 | B2 * | 7/2007 | Zhou et al. .................... 438/696 |
| 7,486,525 | B2 * | 2/2009 | Knickerbocker ............. 361/760 |
| 7,495,340 | B2 * | 2/2009 | Kim .............................. 257/774 |

FOREIGN PATENT DOCUMENTS

| JP | 57-050448 | A | | 3/1982 |
| JP | 4-085933 | A | | 3/1992 |
| JP | 2002-110644 | A | | 4/2002 |
| JP | 2003-173013 | A | | 6/2003 |
| JP | 2003-197738 | A | | 7/2003 |
| JP | 2003-297920 | A | | 10/2003 |
| JP | 2004-095902 | A | | 3/2004 |
| JP | 2004-144975 | A | | 5/2004 |
| KR | 1020040039593 | | * | 5/2004 |

* cited by examiner

*Primary Examiner* — Jenny L. Wagner
(74) *Attorney, Agent, or Firm* — Sughrue Mion, PLLC

(57) ABSTRACT

A multilayer interconnection structure according to this invention is applied to a case where a plurality of interconnections are formed at a fine pitch and a via is connected to at least one of the interconnections. In the multilayer interconnection structure, a region facing the via is locally narrowed in at least the interconnection, facing the via, of the interconnections adjacent to the interconnection connected to the via.

8 Claims, 9 Drawing Sheets

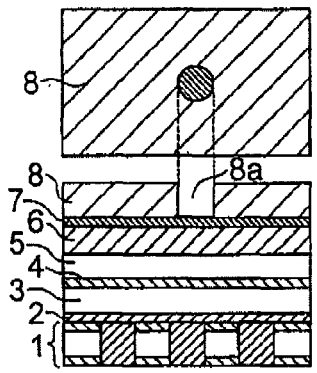 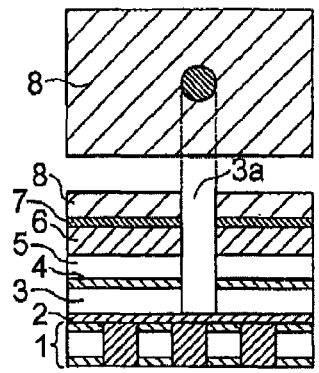 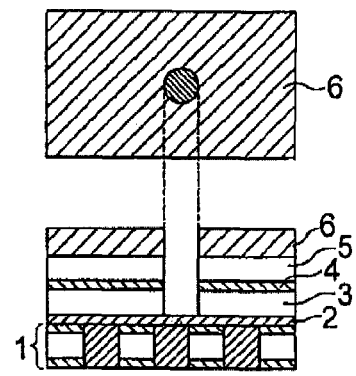
FIG. 1A   FIG. 1B   FIG. 1C
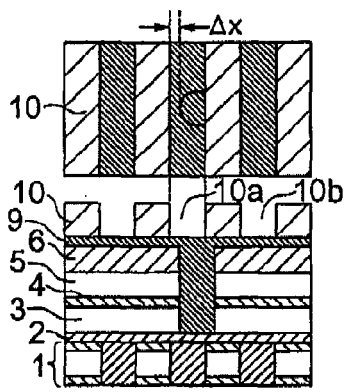 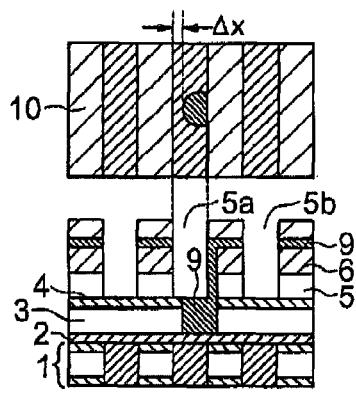 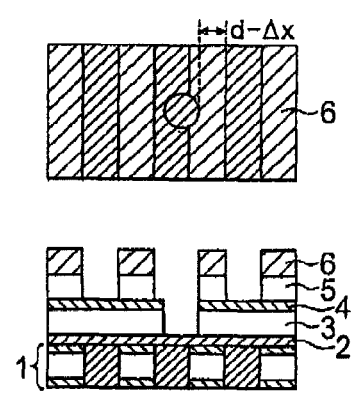
FIG. 1D   FIG. 1E   FIG. 1F
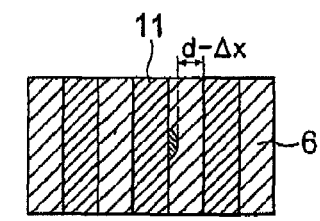
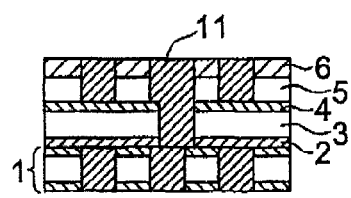
FIG. 1G

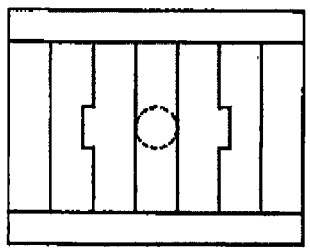
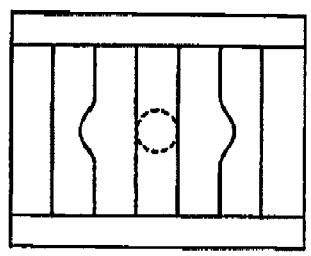
FIG. 5A     FIG. 5B
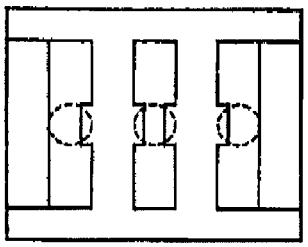
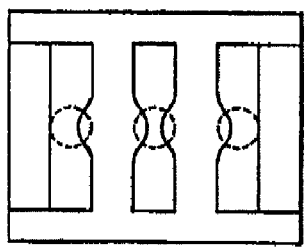
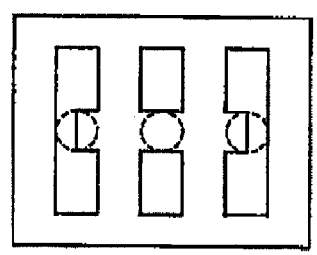
FIG. 5C     FIG. 5D     FIG. 5E

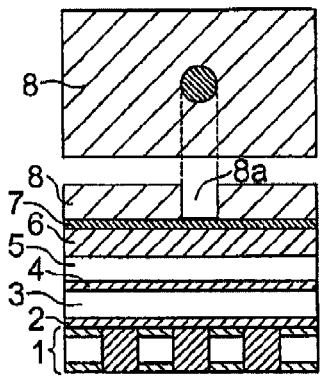
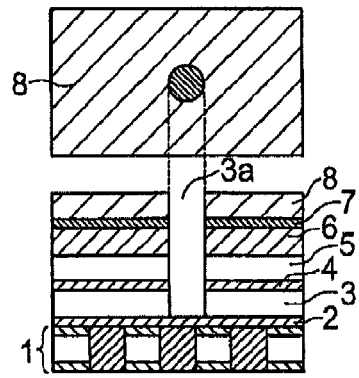
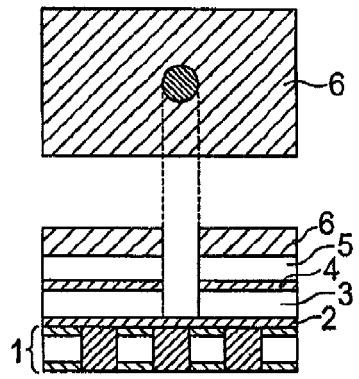
FIG. 8A  FIG. 8B  FIG. 8C
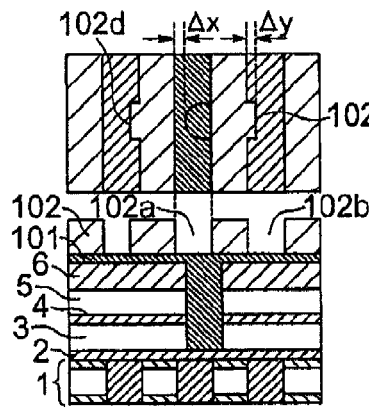
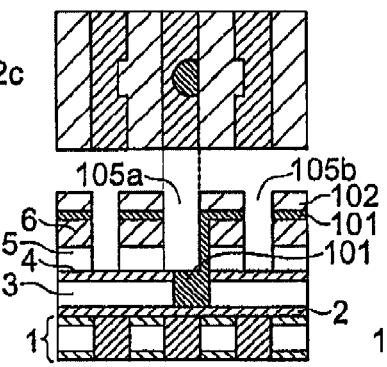
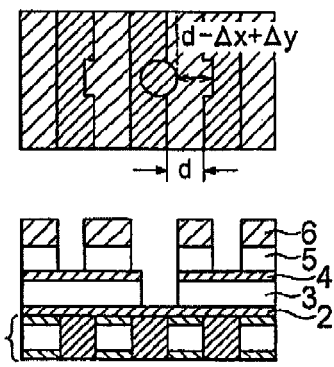
FIG. 8D  FIG. 8E  FIG. 8F
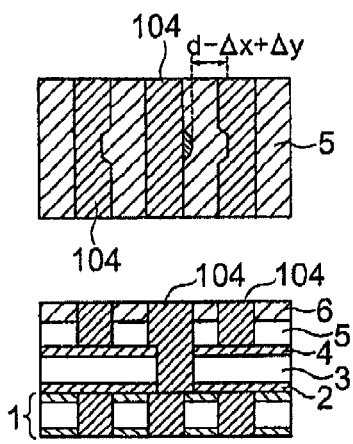
FIG. 8G

MULTILAYER WIRING STRUCTURE, SEMICONDUCTOR DEVICE, PATTERN TRANSFER MASK AND METHOD FOR MANUFACTURING MULTILAYER WIRING STRUCTURE

TECHNICAL FIELD

This invention relates to a multilayer interconnection structure, a semiconductor device having the multilayer interconnection structure, a pattern transfer mask for use in manufacturing the semiconductor device, and a method of manufacturing the multilayer interconnection structure.

BACKGROUND ART

In recent ultra-LSI devices, it is necessary to integrate millions or more of elements on a chip of several mm square and therefore it is essential to miniaturize and multilayer each element. Particularly, in order to increase the device operating speed, it becomes an important subject to reduce the interconnection resistance and the interlayer capacitance.

For reducing the interconnection resistance and the interlayer capacitance, a method is employed that uses copper as an interconnection material and uses as an interlayer insulating film a film having a permittivity lower than that of a silicon oxide film. Further, the dual-damascene method is employed for reducing manufacturing processes and improving reliability of Cu interconnections. In the dual-damascene method, since a copper embedding process and a copper CMP (Chemical Mechanical Polishing) process can be omitted as compared with the single-damascene method, the manufacturing processes are largely shortened.

There is a prior art technique, called a via-first process, for forming a dual-damascene interconnection structure, which will be described hereinbelow.

First, as shown in FIG. 1A, a cap film 2 is formed on an upper surface of a lower interconnection structure 1. A via interlayer film 3 is formed on an upper surface of the cap film 2. As will be described later, the cap film 2 serves as an etching stopper in etching the via interlayer film 3. A stopper film 4 is formed on an upper surface of the via interlayer film 3. Further, a trench interlayer film 5 is formed on an upper surface of the stopper film 4. As will be described later, the stopper film 4 serves as an etching stopper in etching the trench interlayer film 5. Further, a hard mask 6 is formed on an upper surface of the trench interlayer film 5. As will be described later, the hard mask 6 serves as a cap film to prevent the trench interlayer film 5 from directly contacting a plasma. Subsequently, an antireflection film 7 and a photoresist 8 are formed on an upper surface of the hard mask 6. Further, the photoresist 8 is formed with a connection-hole-opening resist pattern 8a using the photolithography technique.

Subsequently, as shown in FIG. 1B, using the photoresist 8 formed with the connection-hole-opening resist pattern 8a as a mask, the antireflection film 7, the hard mask 6, the trench interlayer film 5, the stopper film 4, and the via interlayer film 3 are etched in order, thereby forming a connection-hole opening 3a. In this event, the etching of the via interlayer film 3 stops at the cap film 2.

After removal of the photoresist 8 and the antireflection film 7 as shown in FIG. 1C, an antireflection film 9 and a photoresist 10 are formed on the upper surface of the hard mask 6 as shown in FIG. 1D. The antireflection film 9 serves to protect the cap film 2 exposed at the bottom of the connection-hole opening 3a. Further, the photoresist 10 is formed with interconnection-trench resist patterns 10a and 10b using the photolithography technique.

Subsequently, as shown in FIG. 1E, the antireflection film 9, the hard mask 6, and the trench interlayer film 5 under the trenches of the resist pattern 10a are etched in order, thereby forming interconnection trench patterns 5a and 5b. The cap film 2 at the bottom of the connection-hole opening 3a is protected from an etching plasma by the antireflection film 9. After resist ashing (FIG. 1F), the cap film 2 exposed at the bottom of the connection-hole opening 3a is removed, thereby forming a dual-damascene structure.

Subsequently, as shown in FIG. 1G, copper is embedded in the connection-hole opening 3a and the interconnection trenches 5a and 5b, thereby forming Cu interconnections 11.

If the conventional dual-damascene formation process as described above is carried out using an exposure pattern (pattern transfer mask) produced for single damascene, there may arise a serious problem in the case where a plurality of interconnections (an interconnection interval given by d) are formed at a fine pitch and a via is connected to at least one of the interconnections. If exposure of a via and exposure of an upper-layer interconnection are misaligned with each other by $\Delta x$ as shown in FIG. 1D, the distance between the misaligned via and an interconnection adjacent thereto becomes $(d - \Delta x)$ as shown in FIG. 1G and thus is shortened by $\Delta x$. Since the distance between the adjacent interconnections is shortened, there is concern about a reduction in insulating properties of the interconnections and a possibility of a short circuit therebetween.

In the conventional technique as described above, the dual-damascene method is used for reducing the interconnection processes and improving the reliability of Cu interconnections.

However, in the foregoing dual-damascene formation method, there has been a problem of a reduction in insulating properties of a fine-pitch interconnection pattern with a via.

In order to solve this problem, a new process is required that can suppress a reduction in insulating properties of a fine-pitch interconnection pattern with a via even if a misalignment occurs.

SUMMARY OF THE INVENTION

This invention provides a multilayer interconnection structure that can, even if a via and an upper-layer interconnection are misaligned with each other, prevent a short circuit between interconnections and maintain the insulating properties therebetween.

In a multilayer interconnection structure applied with this invention, a plurality of interconnections, where a metal is embedded in a via opening and interconnection openings at one time, are formed in parallel in a predetermined width as an interconnection pattern for connection to a lower-layer interconnection. According to an aspect of this invention, when the width of the interconnection adjacent to a connecting portion between a via and the interconnection is equal to or greater than the diameter of the via, at least a region facing the via is locally narrowed in the adjacent interconnection.

It is preferable that the locally narrowed interconnection is selectively applied to the case where the interconnection interval is equal to or less than the interconnection width or the interconnection interval is equal to or less than the minimum interconnection width.

According to this invention, there is further provided a semiconductor device having the foregoing multilayer interconnection structure.

In the semiconductor device according to this invention, in the case where at least three interconnections are formed in parallel in a predetermined width in the multilayer interconnection structure forming the semiconductor device and only the middle interconnection thereof is formed with a via, it is preferable that a region facing the via be locally narrowed in each of the interconnections on both sides of the middle interconnection. On the other hand, in the case where at least three interconnections are formed in parallel in a predetermined width in the multilayer interconnection structure forming the semiconductor device, the three interconnections are all formed with vias, respectively, and the vias are linearly aligned, it is preferable that a region connected to the via be locally narrowed from its both sides in the middle interconnection, while, a region facing the via connected to the middle interconnection be locally narrowed in each of the interconnections on both sides of the middle interconnection. Further, it is preferable that a narrowing amount (recessing amount) of the portion locally narrowed be equal to or less than a misalignment amount with respect to the via in interconnection exposure and that the interconnection be smoothly narrowed in an extending direction thereof.

Further, according to this invention, there is provided a pattern transfer mask for transferring a pattern onto a resist in manufacturing a semiconductor device. The pattern transfer mask according to this invention is characterized in that a region corresponding to a formation region of a via is locally narrowed in an interconnection pattern adjacent to an interconnection pattern for transferring an interconnection to be formed with the via.

Further, according to this invention, there is provided a computer program for producing a mask pattern of a pattern transfer mask. The computer program according to this invention causes a computer to execute a layout information acquisition step of acquiring layout information about at least one via and a plurality of interconnections and an interconnection pattern producing step of producing patterns corresponding to the plurality of interconnections with reference to the acquired layout information. Further, in the interconnection pattern producing step, the computer program causes the computer to execute a step of locally narrowing a region corresponding to a formation region of the via in the interconnection pattern adjacent to the interconnection pattern for transferring the interconnection to be formed with the via in the layout of the plurality of interconnections and a step of extracting the portion to be locally narrowed in the layout of the interconnections with reference to the layout information.

Further, according to this invention, there are provided multilayer interconnection structure manufacturing methods. The first manufacturing method comprises a step of forming a via interlayer film, a stopper film, and an interconnection trench interlayer film in the order named on a lower-layer interconnection and a step of forming an inorganic film on the interconnection trench interlayer film. The first manufacturing method further comprises a step of forming a via-opening resist pattern on the inorganic film, then etching the inorganic film, the interconnection trench interlayer film, the stopper film, and the via interlayer film in the order named, and then stripping the via-opening resist pattern using an oxygen plasma. The first manufacturing method further comprises a step of forming, on the inorganic film, a trench resist pattern in which, at a contact portion between a via and a trench, a region that faces the via is locally narrowed in at least an interconnection, that faces the via, of interconnections adjacent to the contact portion, then etching the inorganic film and the interconnection trench interlayer film, and then stripping the trench resist pattern using an oxygen plasma, and a step of simultaneously forming a structure including interconnection trenches and a via opening in the interconnection trench interlayer film.

The second manufacturing method according to this invention comprises a step of forming a via interlayer film, a stopper film, and an interconnection trench interlayer film in the order named on a lower-layer interconnection and a step of forming a first inorganic film, a second inorganic film, a third inorganic film, and a fourth inorganic film in order on the interconnection trench interlayer film. The second manufacturing method further comprises a step of forming a via-opening resist pattern on the fourth inorganic film, then etching the fourth inorganic film, the third inorganic film, the second inorganic film, and part of the first inorganic film, and then stripping the via-opening resist pattern using an oxygen plasma. The second manufacturing method further comprises a step of forming, on the fourth inorganic film, a trench resist pattern in which, at a contact portion between a via and a trench, a region that faces the via is locally narrowed in at least an interconnection, that faces the via, of interconnections adjacent to the contact portion, then etching the fourth inorganic film, and then stripping the trench resist pattern using an oxygen plasma. The second manufacturing method further comprises a step of simultaneously etching the interconnection trench interlayer film and the via interlayer film so as to transfer a dual-damascene structure formed in the second, third, and fourth inorganic films onto the lower layers, thereby simultaneously forming a structure including interconnection trenches and a via opening in the interconnection trench interlayer film.

BRIEF DESCRIPTION OF THE DRAWINGS

FIGS. 1A to 1G are sectional views showing, in order of process, a manufacturing method in the case of forming Cu interconnections for a semiconductor device by the conventional via-first damascene method.

FIGS. 5A to 5E are diagrams each showing a transfer pattern for realizing an interconnection structure of this invention.

FIGS. 8A to 8G are sectional views showing, in order of process, a method of manufacturing a semiconductor device according to a first embodiment of this invention.

BEST MODE FOR CARRYING OUT THE INVENTION

This invention relates to an interconnection structure in which a plurality of interconnections are formed at a fine pitch and is particularly characterized in that a via is connected to at least one of the interconnections and, in a region of a connecting portion between the via and the interconnection, the interconnection adjacent to the connecting portion is recessed in its region facing the connecting portion so that its line width is locally narrowed.

Figure 2:
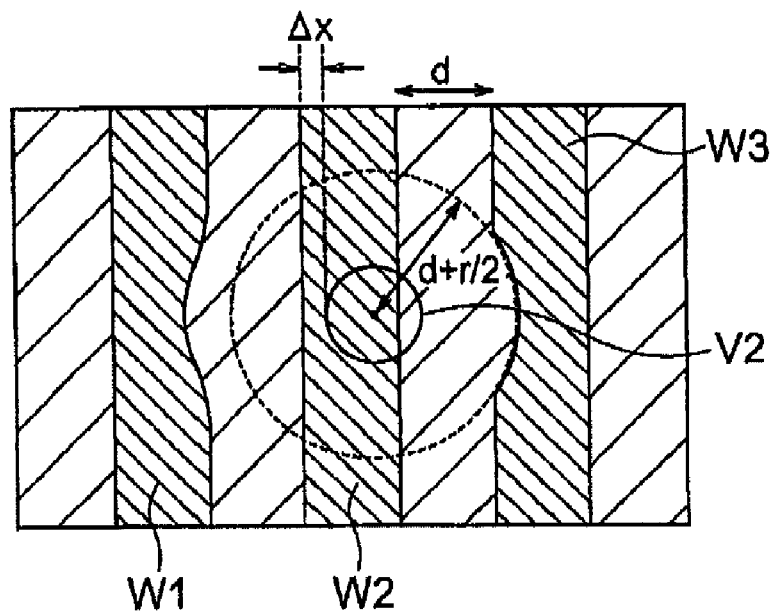
FIG. 2 is a diagram for explaining the concept of this invention and is a diagram exemplarily showing a structure in which the width of each of interconnections adjacent to a via is locally narrowed.

FIG. 2 shows one example. In FIG. 2, among three interconnections W1, W2, and W3 formed at a fine interconnection interval d, a via V2 having a radius (r/2) is connected to the middle interconnection W2. It is assumed that the via V2 is misaligned to the right by $\Delta x$. In this case, a left-side region, facing the via V2, of the right-side interconnection W3 is recessed to thereby locally narrow its line width. This is because if, as shown in FIG. 2, there is no interconnection within a range of [d+(r/2)] from the center of the via V2 having a possibility to be misaligned, it is possible to maintain the insulating properties equivalent to single damascene. Since there is also a case where the via V2 is misaligned in the opposite direction, a right-side region, facing the via V2, of the left-side interconnection W1 is also recessed to thereby locally narrow its line width in FIG. 2.

Figure 3:
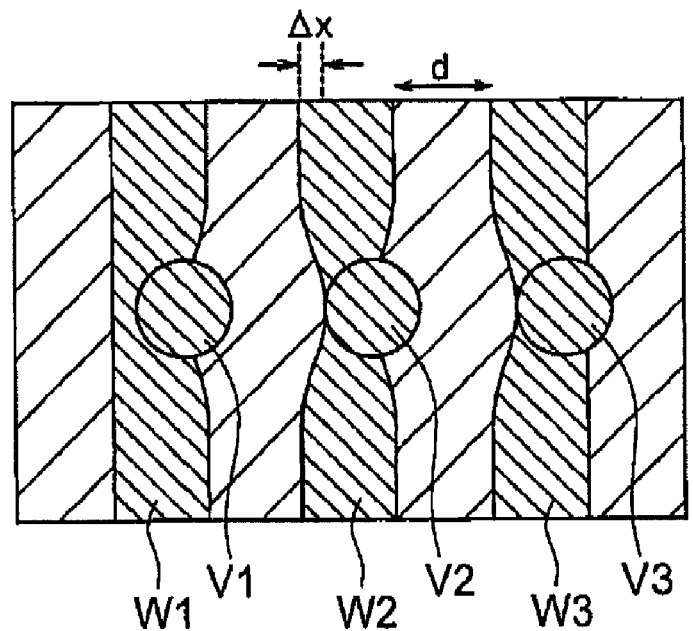
FIG. 3 is a diagram exemplarily showing a structure in which three interconnections formed at a fine pitch are all formed with vias linearly aligned with each other and the width of each of the interconnections adjacent to the vias, respectively, is locally narrowed.
Figure 4A:
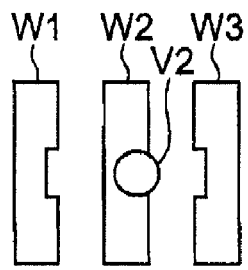
FIGS. 4A to 4J are diagrams each exemplarily showing, as seen from above, dual-damascene interconnections formed according to this invention.
Figure 4E:
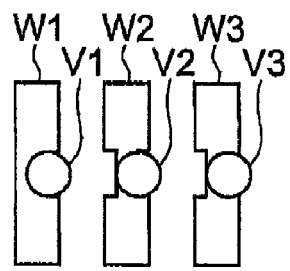
Figure 4I:
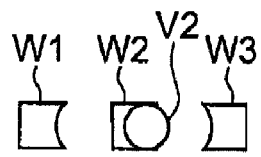
Figure 4B:
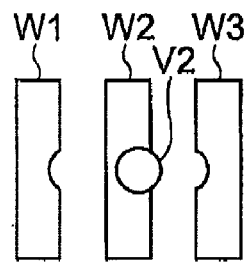
Figure 4F:
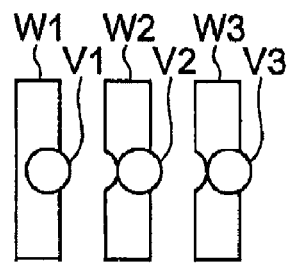
Figure 4J:
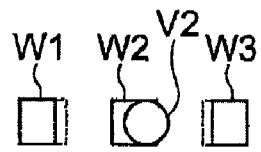
Figure 4C:
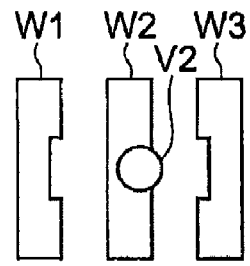
Figure 4G:
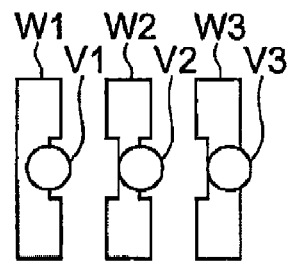
Figure 4D:
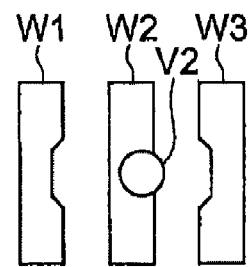
Figure 4H:
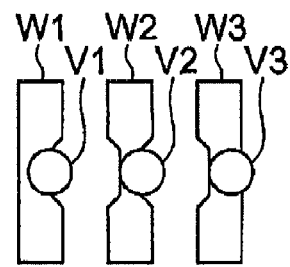

FIG. 3 shows an example in which vias V1, V2, and V3 are connected to three interconnections W1, W2, and W3 formed at an interconnection interval d, respectively, so as to be linearly aligned with each other. In this case, a right-side region, facing the via V2, of the left-side interconnection W1 is recessed to thereby locally narrow its line width. A left-side region, facing the via V2, of the right-side interconnection W3 is recessed to thereby locally narrow its line width. Further, in order to increase the distances from the vias V1 and V3 on both sides, the middle interconnection W2 is recessed in its both-side regions facing the vias V1 and V3, respectively, to thereby locally narrow its line width. As a result of them, even if the vias V1 to V3 are misaligned, since the distance between the misaligned via and the interconnection facing it is maintained equal to or greater than the interconnection interval d, the predetermined insulating properties are ensured. It is necessary that this be applied to the case where the misalignment largely affects the insulating properties and shorting, and therefore, it is preferable that this be selectively used for those interconnection patterns in which the interconnection interval is equal to or less than the interconnection width or equal to or less than the minimum interconnection width. Further, it is not necessarily applied to those portions, such as global interconnections, where the dimensional accuracy may be low.

FIG. 4 are diagrams showing, as seen from above, some examples of dual-damascene interconnections formed according to this invention. The shape recessed for narrowing the line width may be a rectangle as shown in FIG. 4A or a circular arc as shown in FIG. 4B. Since a misalignment of a via may also occur in the vertical direction in the figure, a narrowed portion may be prolonged in the vertical direction in the figure in consideration thereof (FIG. 4C). If there is concern about an increase in resistance value due to the prolongation of the narrowed portion, a trapezoidal recess may be used as shown in FIG. 4D. Further, as a modification of FIG. 4D, an interconnection may be smoothly narrowed in its extending directions. FIGS. 4E to 4H each show an example in which three interconnections formed at a fine pitch are respectively formed with vias that are closely arranged. Also in these examples, the shape of a recess for narrowing the line width may be any shape such as a rectangle, a circular arc, an oblong, or a trapezoid. Further, as long as the foregoing effect can be expected, the shape is not limited to such shapes. Further, as shown in FIGS. 4I and 4J, even if an interconnection has the same shape as that of a via, i.e. takes a shape what is called a stack via, the same effect can be obtained and, therefore, this invention may also be applied thereto.

Further, in order to form various interconnections as described above, there are required pattern transfer masks having a plurality of interconnection patterns as shown in FIGS. 5A to 5E. In the figures, a circle indicated by a broken line shows a portion corresponding to a via formation region. FIGS. 5A and 5B each show a pattern transfer mask used in the case where, among three interconnections arranged at a fine pitch, the middle interconnection is formed with a via, while, FIGS. 5C, 5D, and 5E each show an example of a pattern transfer mask used in the case where three interconnections arranged at a fine pitch are all formed with vias, respectively. The mask may be one for forming rectangular recesses as shown in FIG. 5A or 5C or may be one for forming interconnections each smoothly narrowed in its extending directions by a curved recess as shown in FIG. 5B or 5D. Further, in the case where three interconnections are all formed with vias, use may be made of a pattern transfer mask with no interconnection at a via forming portion as shown in FIG. 5E. By incorporating a function of automatically narrowing interconnections into a software of a CAD system using a computer for designing the foregoing resist patterns, the efficient design development is enabled.

Figure 6A:
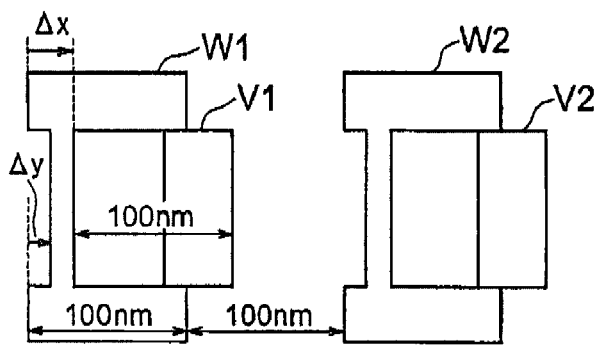
FIGS. 6A and 6B are diagrams for explaining that the short yield is improved by locally narrowing an interconnection.
Figure 6B:
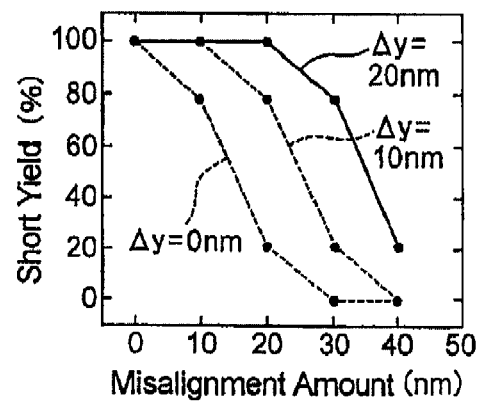

FIG. 6B shows the results of estimating the via misalignment amount dependence of short yield of an interconnection structure having interconnections W1 and W2 and vias V1 and V2 as shown in FIG. 6A. Herein, it is assumed that a spread of $3\sigma=30$ nm occurs in terms of probability in interconnection alignment. Further, based on actual interconnection forming process data, the estimation was carried out using a model that causes a short circuit when interconnections approach each other at 70 nm or less. The yield decreases to 20% with a misalignment of 20 nm when the interconnection is not narrowed (narrowing amount $\Delta y=0$), while, the yield can be improved to 80% by locally narrowing the interconnection by 10 nm ($\Delta y=10$ nm). Further, the yield can be 100% by locally narrowing the interconnection by 20 nm ($\Delta y=20$ nm).

Figure 7A:
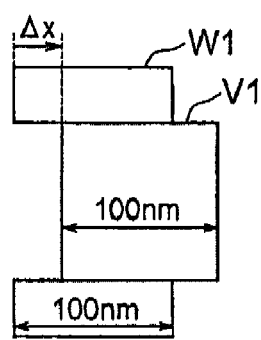
FIGS. 7A and 7B are diagrams for explaining that the resistance does not increase even by locally narrowing an interconnection.
Figure 7B:
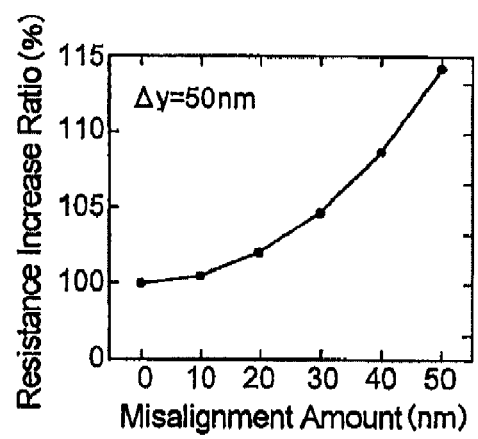

When the interconnection is locally narrowed, the interconnection is somewhat narrowed. However, since the misalignment amount is about 20% of the interconnection interval at most, the influence on the interconnection resistance is small. FIG. 7B shows the results of estimating the increase ratios of interconnection resistance due to misalignment amounts $\Delta x$ using an interconnection structure having a via V1 and an interconnection W1 as shown in FIG. 7A. Since the capability of an ArF exposure apparatus is considered to be a misalignment amount of 20 nm or less, the interconnection resistance increase ratio is 2% or less and thus the interconnection resistance hardly increases. Further, the influence on the interconnection resistance is further reduced by selectively employing this invention only for those interconnection patterns in which the interconnection interval is twice or less the interconnection width.

Since the exposure margin is narrowed following the miniaturization of semiconductor devices, compensation for insulating properties with respect to misaligned vias is essential for improving the performance of the semiconductor devices.

Embodiments of this invention will be described in detail with reference to the drawings.

First Embodiment (Resist Process)

FIGS. 8A to 8G are sectional views exemplarily showing processes for manufacturing a semiconductor device according to a first embodiment of this invention. A silicon carbonitride film 2 is formed as a cap film on a lower-layer interconnection 1 of a semiconductor substrate. On this film 2, an SiOCH film 3 is formed as a via interlayer low-permittivity film by the plasma CVD method. On this SiOCH film 3, a silicon oxide film 4 as an interconnection trench etching stopper film and a porous SiOCH film 5 as a trench interlayer low-permittivity film are formed by the plasma CVD method. Further, a silicon oxide film 6 is formed as a cap film for the porous SiOCH film 5. Thereafter, an antireflection layer 7 and a photoresist layer 8 are formed on the silicon oxide film 6. Further, the photoresist layer 8 is formed with a connection-hole-opening resist pattern 8a using the photolithography technique (FIG. 8A). Subsequently, as shown in FIG. 8B, using the photoresist layer 8 formed with the connection-hole-opening resist pattern 8a as a mask, the antireflection film 7, the silicon oxide film (hard mask) 6, the porous SiOCH film (trench interlayer film) 5, the silicon oxide film (stopper film) 4, and the SiOCH film (via interlayer film) 3 are etched in order, thereby forming a connection-hole opening 3a.

After removal of the photoresist layer 8 and the antireflection film 7 as shown in FIG. 8C, an antireflection film 101 and a photoresist layer 102 are formed on the upper surface of the hard mask 6 as shown in FIG. 8D. The antireflection film 101 serves to protect the cap film 2 at the bottom of the connection-hole opening 3a. Further, the photoresist layer 102 is formed with interconnection-trench resist patterns 102a and 102b using the photolithography technique. FIG. 8D shows the case where the interconnection trench pattern is out of alignment with a via pattern by $\Delta x$ and, in this case, regions 102c and 102d that face the via are each narrowed by a narrowing amount $\Delta y$ in the exposure pattern.

Subsequently, as shown in FIG. 8E, the antireflection film 101, the hard mask 6, and the trench interlayer film 5 under the trenches of the resist pattern 102a are etched in order, thereby forming interconnection trench patterns 105a and 105b. The cap film 2 at the bottom of the connection-hole opening 3a is protected from an etching plasma by the antireflection film 101. In this event, given that the interconnection interval is d, the distance between the misaligned via and the interconnection becomes $(d-\Delta x+\Delta y)$ (FIG. 8F). By properly determining the narrowing amount $\Delta y$ with respect to the expected misalignment amount $\Delta x$, the distance between two interconnections can be maintained at d in any regions. For example, if the alignment accuracy of an ArF exposure apparatus is about 20 nm or less, the distance of substantially d can be ensured between the interconnections by setting the narrowing amount $\Delta y$ to 20 nm. Further, after resist ashing, the cap film 2 is removed and copper is embedded in the connection-hole opening (via opening) 3a and the interconnection trenches, thereby forming Cu interconnections 104 (FIG. 8G). Incidentally, the interconnection trench may also be called an interconnection opening.

As described above, by recessing the via-facing region of the interconnection adjacent to the via to locally narrow the interconnection, it is possible to form the high-accuracy dual-damascene interconnection structure that can avoid a possibility of a short circuit and thus ensure the insulating properties between the interconnections without increasing the interconnection resistance.

In the first embodiment, the SiOCH film is used as the via interlayer low-permittivity film 3. However, if the same processes are applicable, it is not limited to the SiOCH film but may be an SiC film, an organic-film-series low-permittivity film, a porous MSQ or HSQ film, or a silicon oxide film.

Further, in the first embodiment, the example is shown where the etching stopper film 4 separating the trench portion and the via portion is provided between the low-permittivity film 3 and the low-permittivity film 5. However, naturally, the etching stopper may be omitted.

Second Embodiment (Hard Mask Process)

FIGS. 9A to 9K are sectional views exemplarily showing processes for manufacturing a semiconductor device according to a second embodiment of this invention. A silicon carbonitride film 2 is formed as a cap film on a lower-layer interconnection 1 of a semiconductor substrate. On this film 2, an SiOCH film 3 is formed as a via interlayer low-permittivity film by the plasma CVD method. On this SiOCH film 3, a silicon oxide film 4 as an interconnection trench etching stopper film and a porous SiOCH film 5 as a trench interlayer low-permittivity film are formed by the plasma CVD method. Further, on the porous SiOCH film 5, a silicon oxide film 6 as a first hard mask, a silicon nitride film 207 as a second hard mask, a silicon oxide film 208 as a third hard mask, and a silicon nitride film 209 as a fourth hard mask are formed in the order named using the plasma CVD method.

Figures 9A, 9B, 9C, 9D, 9E, 9F, 9G, 9H, 9I, 9J, 9K:
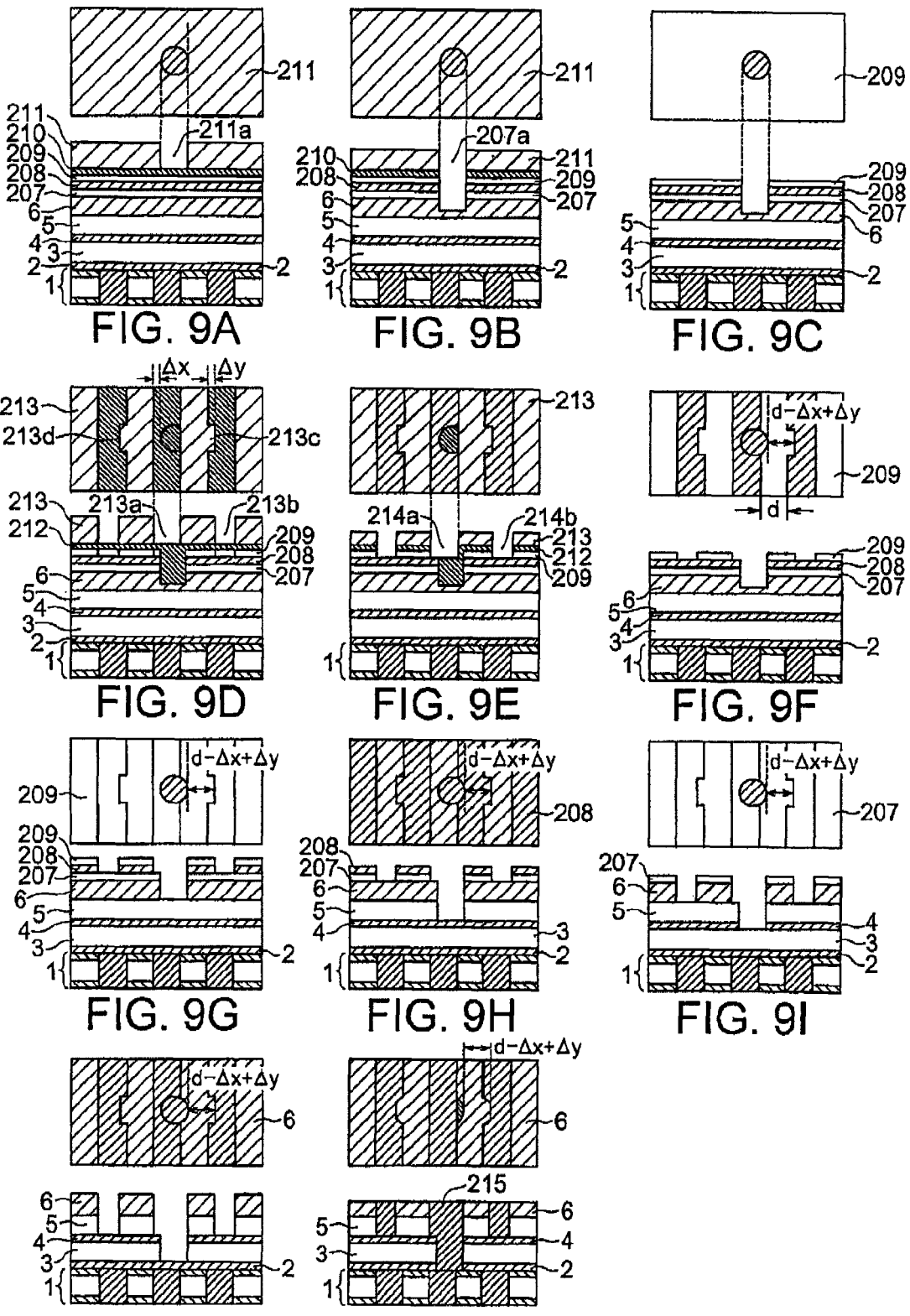
FIGS. 9A to 9K are sectional views showing, in order of process, a method of manufacturing a semiconductor device according to a second embodiment of this invention.

Thereafter, an antireflection layer 210 and a photoresist layer 211 are formed on the silicon nitride film 209. Further, the photoresist layer 211 is formed with a connection-hole-opening resist pattern 211a using the photolithography technique (FIG. 9A). Using the photoresist layer as a mask, the antireflection film 210, the silicon nitride film 209, the silicon oxide film 208, the silicon nitride film 207, and part of the silicon oxide film 206 are etched by the use of a fluorine-based plasma (FIG. 9B), and then the photoresist layer 211 is stripped using an oxygen plasma (FIG. 9C). In this event, since the silicon oxide film 6 being the lower-layer hard mask is present at the bottom of a via opening pattern 207a formed in the upper-layer hard masks, the porous SiOCH film 5 is not etched. Naturally, oxygen radical ashing can be used for this photoresist stripping. In this case, the photoresist can be removed by ashing with almost no shoulder loss of the silicon nitride film 209 which serves as the upper-layer hard mask. Thereafter, again, an antireflection film 212 and a second photoresist layer 213 are formed, and the photoresist layer 213 is formed with trench patterns 213a and 213b (FIG. 9D). FIG. 9D shows the case where the interconnection trench pattern is out of alignment with a via pattern by a misalignment amount $\Delta x$ and, in this case, regions 213c and 213d that face the via are each narrowed by a narrowing amount $\Delta y$ in the exposure pattern. Using this second photoresist pattern, the antireflection film 212 and the silicon nitride film 209 are etched in order (FIG. 9E). Further, formation of a trench photoresist pattern is carried out using oxygen radical ashing (FIG. 9F). Also in this case, the ashing removal can be achieved with almost no shoulder loss of the hard mask. In this event, the distance between the misaligned via and the interconnection facing it becomes $(d-\Delta x+\Delta y)$. By properly determining the narrowing amount $\Delta y$ with respect to the expected misalignment amount $\Delta x$, the distance between the interconnections can be maintained at d. For example, if the alignment accuracy of an ArF exposure apparatus is about 20 nm or less, it is possible to ensure substantially d as the distance between the interconnections by setting the narrowing amount Δy to 20 nm.

Thereafter, using the silicon nitride film 209 as a mask, the lowermost-layer hard mask 6 in the form of the silicon oxide film is etched (FIG. 9G). In this event, the hard mask 208 in the form of the silicon oxide film is also etched simultaneously at portions that become interconnection portions. Further, the porous SiOCH film 5 is etched (FIG. 9H). In this event, there is a high possibility that the uppermost-layer silicon nitride film 209 is removed by etching and, therefore, FIG. 9H shows the state where it is removed. Naturally, the silicon nitride film 209 is not necessarily removed. Further, the hard mask 6 in the form of the silicon oxide film at its portions that become trenches and the stopper film 4 in the form of the silicon oxide film at its portion that becomes a via are simultaneously etched (FIG. 9I). In this event, the silicon oxide film 208 is removed.

Further, the porous SiOCH film 5 (trench portion) 5 and the SiOCH film 3 (via portion) are simultaneously etched (FIG. 9J). In this event, there is a high possibility that the silicon nitride film 207 is removed by etching and, therefore, FIG. 9J shows the state where it is removed. Naturally, the silicon nitride film 209 is not necessarily removed. Finally, the cap film 2 is etch-backed and copper is embedded in the connection-hole opening (via opening) and the interconnection trenches, thereby forming Cu interconnections 215 (FIG. 9K). In the completed interconnections, the shortest distance between the edge of the misaligned via and the interconnection is (d−Δx+Δy) and thus it is seen that it is possible to maintain d as the distance between the interconnections by setting the narrowing amount Δy close to the expected misalignment amount Δx.

As described above, by recessing the via-facing region of the interconnection adjacent to the via to locally narrow the interconnection, it is possible to form the high-accuracy dual-damascene structure that can avoid a possibility of a short circuit and thus ensure the insulating properties between the interconnections without increasing the interconnection resistance.

Also in the second embodiment, the SiOCH film is used as the via interlayer low-permittivity film 3. However, if the same processes are applicable, it is not limited to the SiOCH film but may be an SiC film, an organic-film-series low-permittivity film, a porous MSQ or HSQ film, or a silicon oxide film. Although the example is shown where the etching stopper film 4 separating the trench portion and the via portion is provided between the low-permittivity film 3 and the low-permittivity film 5, the etching stopper may naturally be omitted.

Third Embodiment

Figure 10:
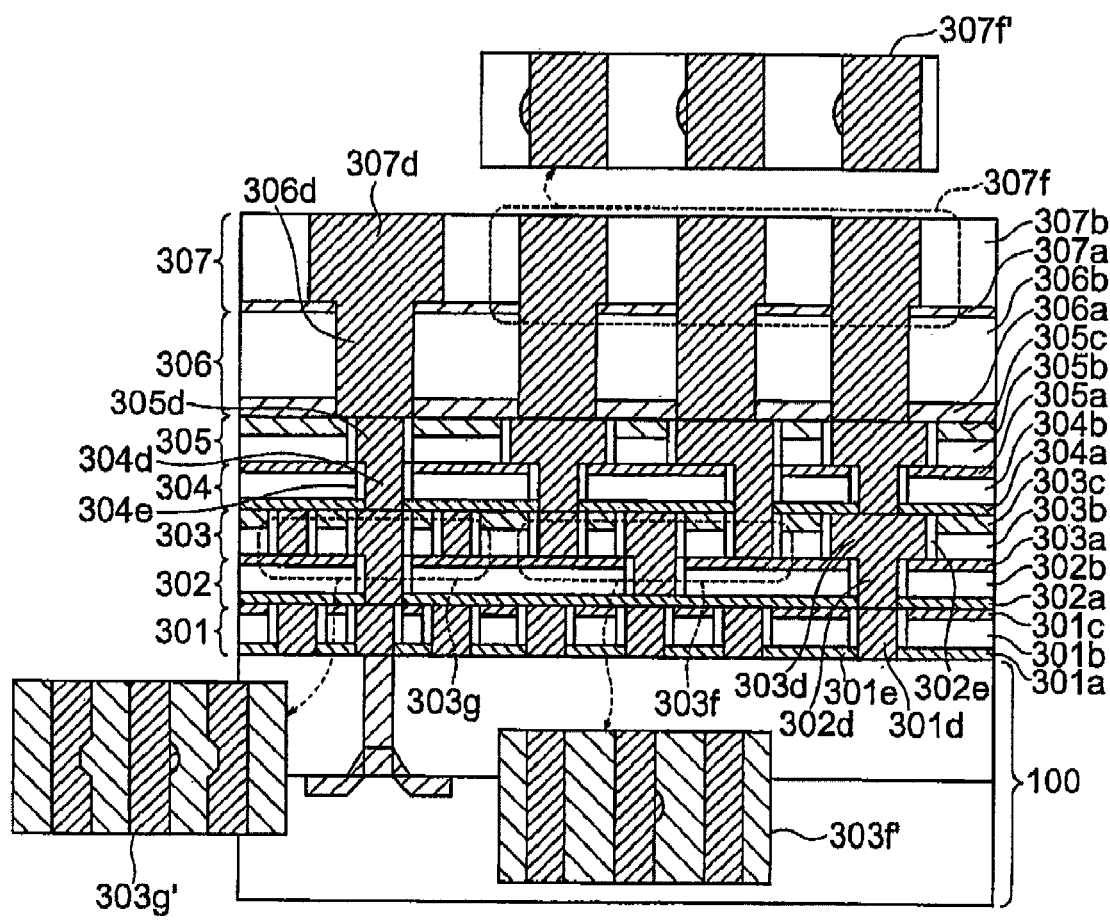
FIG. 10 is a sectional view showing a semiconductor device according to a third embodiment of this invention.

FIG. 10 shows a third embodiment wherein copper multilayer interconnections are formed in carbon-containing low-permittivity insulating films. Also in the third embodiment, when a via is formed at a fine-pitch interconnection portion in the dual-damascene structure, an interconnection region facing the via is locally narrowed. Herein, the case is shown in which an SiOCH film or a porous SiOCH film is used as each of first to fourth interlayer films being carbon-containing low-permittivity films. However, it may be, for example, a plasma-polymerized BCB film using DVDS-BCB, an amorphous SiOCH film obtained by plasma oxidation decomposition of ring-methyl silica, or an amorphous SiOCH film obtained by plasma oxidation decomposition of trimethylsilane. A porous organic silica film or the like having a framework of methyl silica is also applicable or use can be made of an amorphous SiOCH film obtained by He plasma decomposition of methoxymethyl silica.

In FIG. 10, a first-layer Cu interconnection 301 is formed on a substrate formed with an MOSFET (not shown) in a lower layer denoted by reference numeral 100. The interlayer structure of the Cu interconnection 301 comprises a silicon carbonitride film 301a with a thickness of 30 nm formed as an interconnection-trench etch stop layer, a porous SiOCH film 301b with a thickness of 100 nm formed thereon as an interconnection-trench interlayer film, and a silicon oxide film 301c with a thickness of 50 nm formed thereon as a low-permittivity film cap film. The first-layer Cu interconnection 301 is configured such that a Cu film 301d covered with a barrier film of Ta (10 nm)/TaN (10 nm) is embedded in interconnection trenches each penetrating a stacked insulating film in the form of the silicon oxide film 301c/porous SiOCH film 301b/silicon carbonitride film 301a. Side walls of the interconnection trenches in the porous SiOCH film 301b may be pore-sealed with a BCB film 301e formed by plasma polymerization. The first-layer Cu interconnection 301 is connected to contact plugs so as to be electrically connected to an electrical element such as the MOSFET in the lower layer.

On the first-layer Cu interconnection 301, a silicon carbonitride film 302a with a thickness of 50 nm is formed as a via etching stop layer for forming a first via plug 302. Further, an SiOCH film 302b with a thickness of 100 nm and a silicon oxide film 303a with a thickness of 50 nm as an interconnection-trench etch stop layer are formed. The SiOCH film 302b may be flattened by CMP or the like. Further, on the silicon oxide film 303a, a porous SiOCH film 303b with a thickness of 150 nm and a silicon oxide film 303c with a thickness of 50 nm as a hard mask therefor are formed for forming a second-layer Cu interconnection 303. With respect to this stacked-structure insulating film, second Cu interconnections 303d are formed by embedding a Cu film in interconnection trenches each penetrating the silicon oxide film 303c/porous SiOCH film 303b. The interconnection trenches are not necessarily on the silicon oxide film 303a, but may be in the silicon oxide film 303a or may penetrate the silicon oxide film 303a. First Cu via plugs 302d each penetrating the SiOCH film 302b and the silicon carbonitride film 302a are formed from bottom portions of the second Cu interconnections 303d, respectively, so as to be connected to the first-layer Cu interconnection 301. Side walls of the interconnection trenches in the porous SiOCH film 303b and of via openings in the SiOCH film 302b may be pore-sealed with a BCB film 302e formed by plasma polymerization.

In FIG. 10, 303f and 303g' are diagrams showing, as seen from above, sectional portions denoted by 303f and 303g, respectively. In the sectional portion 303g, the Cu interconnections are formed at a fine interconnection pitch and, therefore, regions corresponding to the via are recessed so as to be locally narrowed in the interconnections on both sides of and adjacent to the interconnection connected to the via. On the other hand, in the sectional portion 303f, the interconnection pitch of the Cu interconnections is not small and therefore it is not necessary to locally reduce the interconnection width.

On the second-layer Cu interconnection 303, a silicon carbonitride film 304a with a thickness of 50 nm is formed as a via etching stop layer for forming a second via plug 304. Further, an SiOCH film 304b with a thickness of 100 nm and a silicon oxide film 305a with a thickness of 50 nm as an interconnection-trench etch stop layer are formed. The SiOCH film 304b may be flattened by CMP or the like. Further, on the silicon oxide film 305a, a porous SiOCH film 305b with a thickness of 150 nm and a silicon oxide film 305c with a thickness of 50 nm as a hard mask therefor are formed for forming a third-layer Cu interconnection 305. With respect to this stacked-structure insulating film, second Cu interconnections 305d are formed by embedding a Cu film in interconnection trenches each penetrating the silicon oxide film 305c/porous SiOCH film 305b. The interconnection trenches are not necessarily on the silicon oxide film 305a, but may be in the silicon oxide film 305a or may penetrate the silicon oxide film 305a. Second Cu via plugs 304d each penetrating the SiOCH film 304b and the silicon carbonitride film 304a are formed from bottom portions of the second Cu interconnections 305d, respectively, so as to be connected to the second-layer Cu interconnection 303. Side walls of the interconnection trenches in the porous SiOCH film 305b and of via openings in the SiOCH film 304b may be pore-sealed with a BCB film 304e formed by plasma polymerization. In the third-layer Cu interconnection 305, fine-pitch interconnections are not present and therefore there is no interconnection that is locally narrowed. In this manner, it may be configured that no interconnection is locally narrowed depending on an interconnection layer even if it has the same layer structure.

On the third-layer Cu interconnection 305, a silicon carbonitride film 306a with a thickness of 100 nm is formed as a via etching stop layer for forming a global-interconnection via plug 306. Further, a silicon oxide film 306b with a thickness of 500 nm and a silicon carbonitride film 307a with a thickness of 100 nm as an interconnection-trench etch stop layer are formed. Further, on this silicon carbonitride film 307a, a silicon oxide film 307b with a thickness of 700 nm is formed for forming a global interconnection 307. With respect to this stacked-structure insulating film, fourth Cu interconnections 307d are formed by embedding a Cu film in interconnection trenches each penetrating the silicon oxide film 307b. The interconnection trenches are not necessarily on the silicon carbonitride film 307a, but may be in the silicon carbonitride film 307a or may penetrate the silicon carbonitride film 307a. Third Cu via plugs 306d each penetrating the silicon oxide film 306b and the silicon carbonitride film 306a are formed from bottom portions of the fourth Cu interconnections 307d, respectively, so as to be connected to the third-layer Cu interconnection 305. In the fourth-layer Cu interconnection 307, a sectional portion denoted by 307f is fine-pitched, but, as shown at 307f' which is a diagram of this sectional portion as seen from above, if the width dimension is large as compared with the lower-layer interconnection and is much larger than an expected misalignment amount, it is not necessary to locally narrow the width of the interconnection adjacent to the via. In this manner, it may be configured that no interconnection is locally narrowed depending on the relationship between the interconnection interval and the interconnection width.

In this embodiment, there is shown the example of three-layer Cu/low-permittivity film interconnections and one-layer CU/SiO$_2$ interconnection. However, the number of interconnection layers may be any.

As described above, in the case where a plurality of interconnections are formed at a fine pitch and a via is connected to at least one of the interconnections, by recessing a via-facing portion of the interconnection adjacent to the via to locally narrow the interconnection, the short margin and dielectric strength between the interconnections in the via-connected interconnections are significantly improved while suppressing an increase in interconnection resistance.

According to this invention, in the dual-damascene interconnection method, a multilayer interconnection structure is realized that can maintain the insulating properties in a fine-pitch interconnection pattern with a via, to a degree equivalent to that with no via.

Fourth Embodiment

Figure 11:
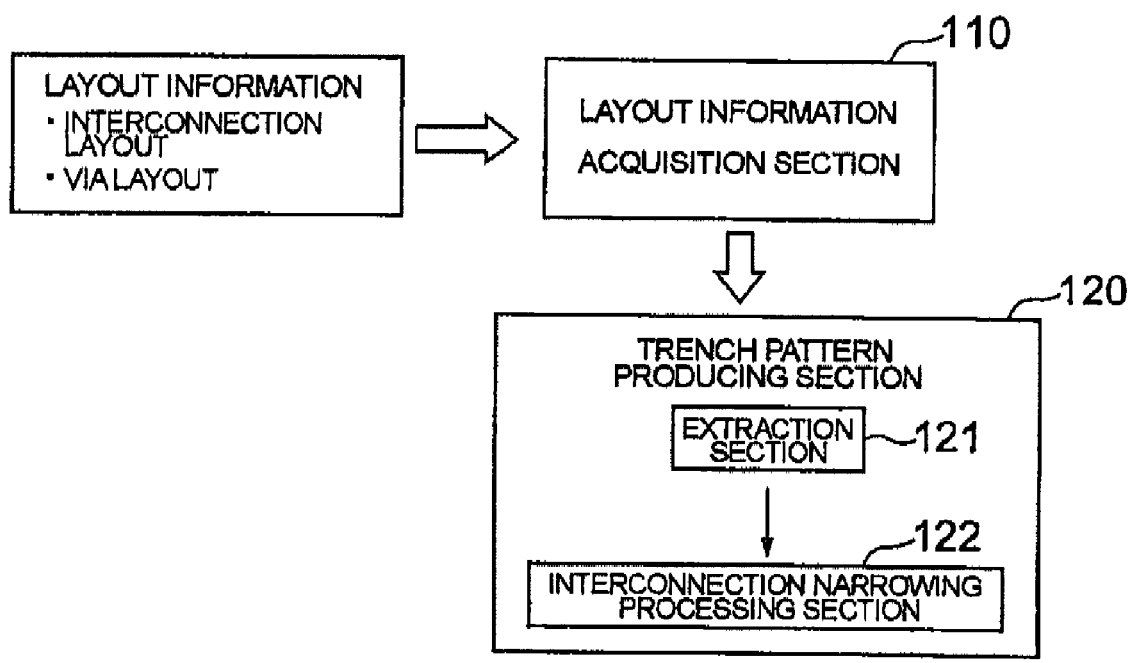
FIG. 11 is a diagram for explaining a fourth embodiment of this invention and is a block diagram for explaining functions of a computer realized by a program according to this invention.

A fourth embodiment relates to a computer program or a CAD software for producing a pattern transfer mask such as described with reference to each of FIGS. 5A to 5E. As shown in a block diagram of FIG. 11, the computer program or the CAD software according to this embodiment is installed in a computer or a CAD apparatus to cause it to function as an apparatus including a layout information acquisition section 110 and a trench pattern producing section 120. The trench pattern producing section 120 includes an extraction section and an interconnection narrowing processing section 122.

First, the layout information acquisition section 110 acquires information about the layout of a semiconductor device, for example, from a database through an input operation by an operator. In this event, the acquired layout information includes layout information about dual-damascene structure vias and trenches.

Next, the trench pattern producing section 120 produces trench patterns with reference to the acquired layout information. Specifically, the extraction section 121 refers to the layout information and extracts a portion to be subjected to interconnection narrowing in the layout of trenches based on the layout information. For example, using the general function of the CAD software, a flag is assigned to an edge of the via-facing trench located at an interval equal to or less than the interconnection width from an edge of a via opening in the layout based on the layout information. Then, the interconnection narrowing processing section 122 narrows a light-shielding pattern at the portion extracted by the extraction section 121. A mask pattern is produced according to such a program.

The invention claimed is:

1. A multilayer interconnection structure comprising:
   a plurality of interconnections formed in parallel in a predetermined width as an interconnection pattern;
   at least one via formed in at least one of the plurality of interconnections and connecting the at least one of the plurality of interconnections to a lower-layer interconnection,
   wherein a width of at least one adjacent interconnection, which is adjacent to the at least one of the plurality of interconnections, is equal to or greater than a diameter of said at least one via, and
   wherein the at least one adjacent interconnection is locally narrowed by recessing only a portion of a side of the at least one adjacent interconnection that faces said at least one via.

2. A multilayer interconnection structure according to claim 1, wherein an interconnection width is locally narrowed in the interconnection pattern in which an interconnection interval is equal to or less than the interconnection width.

3. A multilayer interconnection structure according to claim 1, wherein an interconnection width is locally narrowed in the interconnection pattern in which an interconnection interval is equal to or less than a minimum interconnection width.

4. A semiconductor device according to claim 1, wherein at least three interconnections are formed in parallel in a predetermined width in the multilayer interconnection structure forming the semiconductor device, and wherein only a middle interconnection of the at least three interconnections is formed with a via, and wherein adjacent interconnections, formed adjacent to said middle interconnection, are locally narrowed by recessing only portions of sides of the adjacent interconnections that face the via formed in the middle interconnection.

5. A semiconductor device according to claim 1, wherein at least three interconnections are formed in parallel in a predetermined width in the multilayer interconnection structure forming the semiconductor device, and wherein said at least three interconnections are all formed with vias, respectively, and said vias are aligned at an interconnection interval, wherein portions of both sides of a middle interconnection are locally narrowed in a region in which the middle interconnection is connected to a via, and wherein adjacent interconnections, formed adjacent to said middle interconnection, are locally narrowed by recessing only portions of sides of the adjacent interconnections that face the via formed in the middle interconnection.

6. A semiconductor device according to claim 4, wherein a narrowing amount of the portions locally narrowed in said adjacent interconnections is equal to or less than a misalignment amount with respect to the via in interconnection exposure.

7. A semiconductor device according to claim 4, wherein said interconnections locally narrowed are smoothly narrowed in an extending direction of said interconnections.

8. A semiconductor device according to claim 4, wherein said interconnections locally narrowed are narrowed so as not to be formed within a distance $[(r/2)+d+\Delta x]$ (where $r/2$ is a via radius, $d$ an interconnection interval, and $\Delta x$ an expected value of a misalignment amount with respect to a via in interconnection exposure) from a center of the via.

* * * * *